United States Patent [19]

Kolibas

[11] Patent Number: 4,613,813
[45] Date of Patent: Sep. 23, 1986

[54] ELECTROSTATIC SYSTEM ANALYZER

[75] Inventor: James A. Kolibas, Broadview Heights, Ohio

[73] Assignee: Nordson Corporation, Amherst, Ohio

[21] Appl. No.: 611,863

[22] Filed: May 18, 1984

[51] Int. Cl.$^4$ .............................................. G01R 31/02
[52] U.S. Cl. ...................................... 324/72; 324/115
[58] Field of Search ............... 324/133, 149, 452, 457, 324/72, 72.5, 437, 115

[56] References Cited

U.S. PATENT DOCUMENTS

| | | | |
|---|---|---|---|
| 1,661,913 | 3/1928 | Taylor | 324/437 |
| 2,426,050 | 8/1947 | Radwanski | 324/149 |
| 2,521,548 | 9/1950 | Sittler | 324/133 |
| 4,433,296 | 2/1984 | Kolibas | 324/149 |

Primary Examiner—Stewart J. Levy
Assistant Examiner—Kevin D. O'Shea
Attorney, Agent, or Firm—Wood, Herron & Evans

[57] ABSTRACT

An electrostatic system analyzer for checking the voltage at various test points in a high voltage electrostatic spray coating system. The analyzer includes an elongated analyzer body housing several elongated high voltage resistors making up a high resistance path. One end of the high resistance path is coupled to an ammeter mounted at a proximal end of the analyzer body, and the other end of the resistance path is coupled to an electrode mounted on a fitting at the distal end of the analyzer body. The fitting is rotatably mounted on the analyzer body and is generally L-shaped to position the electrode to be laterally offset from the distal end of the analyzer body. This positioning of the electrode facilitates viewing the electrode when it is placed at test points in the electrostatic coating system. The ammeter has a meter face which includes a different scale related to each test point, with the scales being offset from one another to compensate for resistance differences between the test points.

8 Claims, 6 Drawing Figures

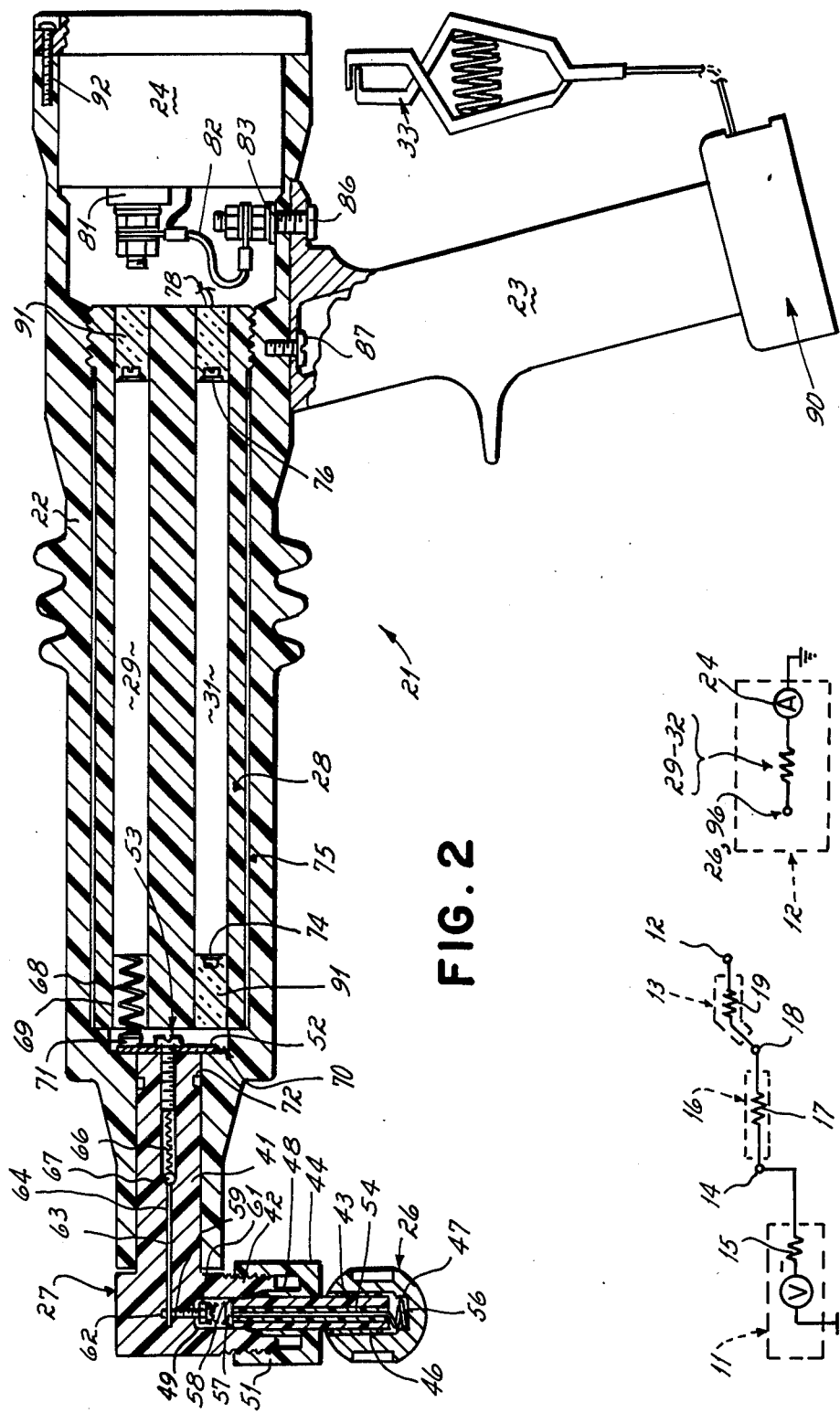

ELECTROSTATIC SYSTEM ANALYZER

DESCRIPTION OF THE INVENTION

This invention relates generally to high voltage electrostatic spray coating systems and more particularly concerns an analyzer for checking the adequacy of the voltage at various test points in such a system.

Electrostatic spray coating systems include as principal components thereof an electrostatic spray gun, a power supply, and a cable for coupling power from the power supply to the gun. In order to maintain proper spraying efficiency, the voltage at a spray gun electrode located near the spray gun nozzle must be kept at a satisfactory level. At times when the spray coating efficiency is unsatisfactory, the electrostatic supply system must be checked to determine if there has been a loss of the requisite spray gun electrode voltage and, if so, at what point in the system the voltage breakdown has occurred. At other times, the voltages at various test points in the electrostatic coating system are checked as a part of the routine maintenance of the coating system.

In checking the voltages in the electrostatic coating system, typically the voltage at the spray gun electrode is first checked, then the voltage at the gun end of the cable after it has been disconnected from the gun, and finally the voltage at the electrostatic power supply, in order to isolate the location of a voltage problem should there be one.

Due to the voltages involved in high voltage electrostatic spray coating systems, typically on the order of 50-125 kilovolts, a voltmeter is not employed for checking the voltage at test points in the electrostatic system. Instead, an ammeter is coupled between each test point and ground through a large series resistance, with the meter providing an indication of the amount of current drawn through the meter and the series resistor. If a typical analog ammeter is used, the face of the meter is marked to be interpreted in terms of voltage rather than current, utilizing the ohmic relationship between voltage and current.

If the cable and gun exhibited negligible electrical resistance, the full electrostatic voltage from the power supply would be present at the gun electrode when the analyzer ammeter is coupled to the gun electrode since there would be virtually no voltage drop between the power supply and the gun electrode.

Unfortunately, for safety reasons, significant resistances are intentionally provided in both the cable and the spray gun in a typical electrostatic spray coating system. Such resistances are added to the gun and cable to limit undesirable current leakage and to minimize the effects of accidental discharge of electrical energy capacitively stored in the gun and in the cable.

When current is drawn through the analyzer, including the analyzer ammeter, from different test points in such an electrostatic spray coating system, the readings obtained differ from point to point despite the fact that the high voltage from the power supply remains constant.

In one form of prior analyzer, the face of the ammeter contains a graduated scale along the path traversed by an ammeter needle. The position of the needle on the scale is interpreted through the use of a separate chart which indicates acceptable ranges of ammeter readings for the different test points in different electrostatic spray coating systems having different power supply output voltages. Reading such a chart while contacting the appropriate test point with the analyzer and reading the meter has proved to be somewhat cumbersome.

In another prior analyzer, the need for a separate chart is overcome by providing an analyzer body in which the resistance of the resistance path from the analyzer test electrode to the analyzer meter can be changed. In this analyzer, the resistance in the resistance path is varied to compensate for the resistances between the test points in the electrostatic coating system so that the total resistance from the coating system voltage supply to the ammeter is always the same. Therefore, only a single meter scale on the ammeter face need be provided for each electrostatic system to be checked.

This prior analyzer takes the form of a gun having a telescoping cylindrical barrel with an exposed test electrode in its forward end, and an ammeter at its rearward end. The forward portion of the analyzer body, which is axially and angularly movable relative to the rearward portion, includes a conductive receptacle electrically connected to the test electrode, and the rearward portion of the analyzer body includes four resistors electrically connected in series. Each of the junction points between the series resistors contains a plug. A selected junction point plug is received in electrical contact with the receptacle of the forward portion of the analyzer body when the two portions of the analyzer body are telescoped together. The number of resistors coupled to the electrode through the receptacle is selected to introduce sufficient resistance into the circuit between the power supply and the ammeter to compensate for the resistance variations among the different test points in the electrostatic system. This prior analyzer, therefore, successfully eliminates the need for a separate chart in coordination with the analyzer. This prior analyzer does introduce additional complexity into the construction of the analyzer body inasmuch as the analyzer body is made up of two separate portions which must be assembled to be movable relative to one another.

It is consequently an objective of the present invention to provide an electrostatic system analyzer which avoids the use of a separate reference chart for interpreting readings at different test points in electrostatic coating systems, and which also avoids the difficulties entailed in altering the value of the resistance in the resistance path of the analyzer.

This is accomplished in accordance with one aspect of the present invention by providing an analyzer having a fixed resistance path in an analyzer body which is coupled between a test electrode and an ammeter, and wherein the meter has a different scale associated with each test point of an electrostatic coating system.

In accordance with a further aspect of the invention, the presently disclosed analyzer includes a fitting, mounted on the analyzer body, which receives the test electrode to laterally offset the electrode from the analyzer body. In this way the electrode and the ammeter are readily simultaneously visible to a user of the analyzer. With this construction, the meter may be easily read while the user of the analyzer assures that the test electrode is satisfactorily contacting a selected test point in the electrostatic coating system.

Further objects and advantages of the present invention, and the manner of their implementation, will become apparent upon reading the following detailed description and upon reference to the drawings, in which:

FIG. 1a is a schematic illustration of the test points in an illustrative electrostatic coating system;

FIG. 1b is a schematic illustration of an analyzer constructed in accordance with the present invention;

FIG. 2 is a side cross-sectional view of an analyzer constructed in accordance with the present invention;

Figure 3:
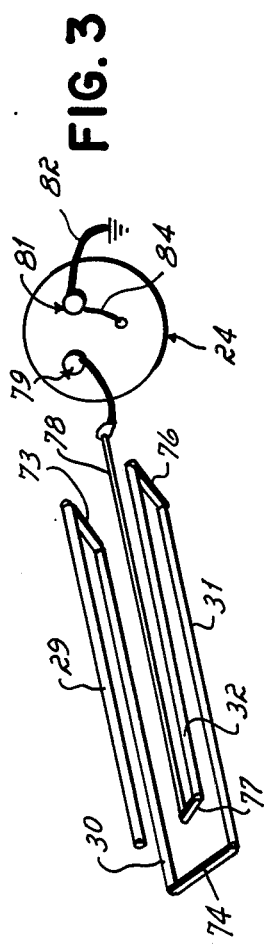
FIG. 3 is a diagrammatic illustration of the series connected resistors of the resistance path for the analyzer of FIG. 2.

While the invention is susceptible to various modifications and alternative forms, certain illustrative embodiments have been shown by way of example in the drawings and will herein be described in detail. It should be understood, however, that it is not intended to limit the invention to the particular form disclosed, but, on the contrary, the intention to cover all modifications, equivalents, and alternatives falling within the spirit and scope of the invention as defined by the appended claims.

Prior to describing the present electrostatic system analyzer, an exemplary electrostatic spray coating system having test points to be measured by such an analyzer shall be briefly described. A typical electrostatic spray coating system includes an electrostatic spray gun including a barrel terminating at its forward end in a nozzle. Coating material is supplied to the gun barrel and coupled therethrough to the nozzle from which it is sprayed onto an object to be coated. An electrode, maintained at a high negative dc potential, charges the coating material exiting the nozzle to enhance the deposition of the coating material onto the article to be coated, which is typically maintained at a ground potential. Often a source of pressurized air is also coupled to the gun barrel to facilitate atomization of the coating material.

The electrical configuration of such a typical electrostatic spray coating system is shown schematically in FIG. 1a and includes a high voltage dc power supply 11 (with its internal resistance shown as a resistor 15) which supplies the high dc potential for the gun electrode 12 at the nozzle of the spray coating gun 13. The output 14 of the power supply 11 is coupled to the gun 13 through a coaxial cable 16 having internal resistance shown diagrammatically as a resistor 17. One end of the cable 16 is connected to the supply output 14, which in practice is usually located within a well (not shown) of a voltage supply housing. The other end of the cable 16 is connected to a terminal 18 of the gun 13. The dc potential at the terminal 18 is typically insulated from electrically conductive portions of the gun 13 such as its handle and also from the nozzle of the gun (not shown) through which the coating material passes. The gun terminal 18 is electrically coupled to the gun electrode 12 through a resistance path represented as a resistor 19. Therefore, the path from the voltage supply output 14 to the gun electrode 12 contains the resistors 17 and 19. There is an additional voltage drop at the supply 11 due to the internal resistance 15.

Exemplary test points for checking the voltage of the electrostatic coating system are at the gun electrode 12, (a measurement at this point being termed a gun measurement), at the terminal 18 after the cable 16 has been disconnected therefrom (for a cable measurement), and at the output 14 of the power supply 11 (for a supply measurement).

With reference now to FIG. 2, an analyzer 21 constructed in accordance with the present invention includes an analyzer body 22 of an electrically insulative material and an electrically conductive handle 23. An ammeter 24 is mounted in an end of the analyzer body 22 proximal to a user of the analyzer 21, and an electrically conductive test electrode 26 is mounted on an insulative fitting 27 rotatably secured at the distal end of the analyzer body. An insulative resistor holder, or module, 28 is mounted within the analyzer body 22. The resistor module 28 contains four resistors 29–32 connected in series (FIG. 3). The test electrode 26 is electrically coupled via the series resistors 29–32 and the ammeter 24 to the conductive handle 23.

Figure 5:
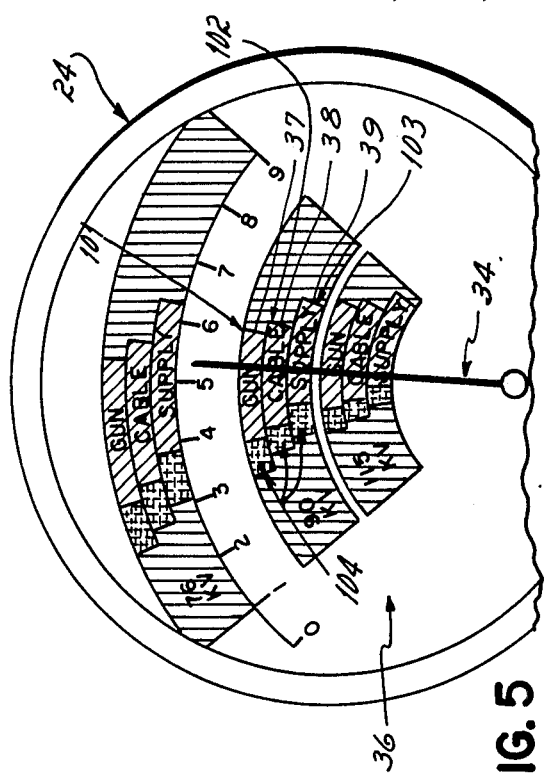
FIG. 5 is an illustration of the face of the meter of the analyzer of FIG. 2.

In operation, the handle 23 is connected to ground by a ground clip 33, and a circuit through the analyzer is established when the electrode 26 contacts a test point in the electrostatic spray coating system. When a circuit is completed, an ammeter needle 34 (FIG. 5) moves across the face 36 of the ammeter 24 by an amount dependent upon the current flow through the ammeter. As shown in FIG. 5, for a given electrostatic system, such as a 90 Kv. system, the meter face 36 includes three scales 37, 38 and 39 corresponding to the gun, cable and supply test points, respectively. The three scales are offset from one another along the path of the meter needle 34 to compensate for resistance differences between the test points in the electrostatic coating system, eliminating the need to refer to a separate chart or to change the series resistance within the analyzer body 22.

In order to facilitate the placement of the test electrode 26 on a test point by a user of the analyzer 21, so that the electrode is not obscured from view behind the meter 24 and the analyzer body 22, the electrode 26 is offset laterally from the distal end of the analyzer body. To accomplish this, the fitting 27 upon which the electrode 26 is mounted is generally L-shaped, having a first leg 41 rotatably received within the distal end of the analyzer body 22 and a second leg 42 extending laterally from the first leg.

To mount the electrode 26 on the leg 42 of the fitting, the electrode is secured on a cable 43 which is also press fit within a nut 44 threadedly received on the leg 42 of the fitting 27. To hold the electrode 26 on the cable 43, one end of the cable is secured within a tolerance ring 46 in a generally cylindrical bore 47 in the electrode. The other end of the cable 43 is secured within an inner cylindrical wall 48 of the nut 44, with this end of the cable extending into a bore 49 in the leg 42 of the fitting 27. The nut 44 further includes an outer cylindrical wall 51 having a threaded inner surface which is threadedly received on the leg 42 of the fitting 27.

The leg 41 of the fitting 27 is rotatably received within the distal end of the analyzer body 22 and retained therein by an electrically conductive washer 52 secured to the fitting 27 by a screw 53. The electrode 26, mounted on the end of the leg 42 of the fitting 27, may consequently be rotated through a 360° circular arc about an axis through the leg 41 of the fitting.

An electrically conductive path is provided from the electrode 26 to the distal end of the resistor 29 at any position of the electrode throughout the circular arc traversed by the electrode. In order to do this, an electrical conductor 54 in the cable 43 terminates in a spring conductor 56 within the bore 47 of the electrode 26. The spring conductor 56 contacts the walls of the bore 47 and electrically connects the electrode through the cable 43 to the end of the cable within the bore 49 of the fitting 27.

This end of the cable 43 terminates in a contact 57 electrically connected to the conductor 54. A spring 58 in the bore 49 has one end secured between a screw 59 and a nut 61 and its other end bearing against the contact element 57 on the end of the cable 43. An electrically conductive path is thereby established by the cable conductor 54 and the contact element 57, through the spring 58, to the nut 61 and the screw 59, so that the electrode 26 is electrically connected to the screw 59.

To complete the electrically conductive path from the electrode 26 to the distal end of the resistor 29, the shaft of the screw 59 is threadedly received in a bore 62 in the fitting 27, and the shaft of the screw is in electrical contact with a pin 63 in a bore 64 in the leg 41 of the fitting 27 which intersects the bore 62.

A spring 66 in the bore 64 is compressed between a head 67 of the pin 63 and an end of the screw 53 which secures the washer 52 to the fitting 27. The pin 63, the spring 66, the screw 53, and the washer 52 are electrically conductive and provide an electrical connection from the screw 59 to the washer 52. The electrode 26 is thereby electrically connected to the washer 52.

To maintain electrical contact between the washer 52 and the distal end of the resistor 29, a spring 68 is held in compression within a bore 69 in the resistor module 28. The spring 68 is attached at one end to the distal end of the resistor 29 and is attached at its other end to a contact element 71 which is urged against a face of the washer 52. As the washer 52 is rotated with the fitting 27 and the electrode 26, the contact element 71 remains in electrical contact with the washer, and consequently the electrode 26 is continuously in electrical contact with the distal end of the resistor 29. A circuit path is further provided from the distal end of the resistor 29, which is electrically connected to the electrode 26, through the resistors 29–32 and the ammeter 24 to ground through the conductive handle 23 and the grounding clip 33.

For corona prevention, the bore 69 in the resistor module 28 is packed with a dielectric grease. To further prevent corona, the area 70 (adjacent the washer 52) within the analyzer body 22 is also filled with dielectric grease. In practice, a sufficient quantity of dielectric grease is placed within the analyzer body 22 in the vicinity of the washer 52 (prior to the insertion of the resistor module 28 into the analyzer body) so that when the resistor module is inserted, the dielectric grease not only fills the area 70, but is also forced into the annular space 75 between the resistor module and the analyzer body. When the resistor module 28 is fully inserted into the analyzer body 22, the dielectric grease in the analyzer body 22 is forced into the annular space 75, purging the air from this space for a substantial distance, such as three-quarters of the way from the area 70 to the rear of the resistor module.

The leg 41 of the fitting 27 is generally cylindrical, and is received within a generally cylindrical bore within the distal end of the analyzer body 22. To prevent the migration of the dielectric grease from the area 70 toward the electrode 26, an O-ring seal 72 is carried in an annular groove in the outer wall of the leg 41 of the fitting 27. In practice, the O-ring seal 72 also serves to prevent cleaning solvent, which might be used to clean the electrode 26, from flowing along the outer wall of the leg 41 of the fitting 27 into the interior of the analyzer body and into contact with the washer 52.

The resistors 29–32 are received in axial bores in the resistor module 28, in an array as shown in FIG. 3. The electrical circuit path through the resistors is from the distal end of the resistor 29, through the resistor 29, through a conductive strap 73, the resistor 30, a conductive strap 74, the resistor 31, a conductive strap 76, the resistor 32, a conductive strap 77, and a conductor 78. The proximal end of the conductor 78 is secured to a terminal 79 of the ammeter 24. The other terminal 81 of the ammeter is electrically connected by a cable 82 to a terminal 83 electrically connected to the conductive handle 23. The ground terminal 81 of the meter 24 is also connected by a conductor 84 to the ammeter case. A screw 86 mechanically attaches the conductive handle 23 to the analyzer body 22, and also serves to carry the terminal 83 which is coupled to the ground terminal 81 of the ammeter 24. A second screw 87 further mechanically secures the handle 23 to the analyzer body.

The ends of the bores in the resistor module 28, and interconnecting slots for the connector straps 73–77, are filled with potting compound 91. The ammeter 24 is secured to the proximal end of the analyzer body 22 by screws 92. The electrically conductive handle 23 is electrically connected to the grounding clip 33 through a grounding cable reel assembly 90 at the lower end of the handle 23.

Figure 4:
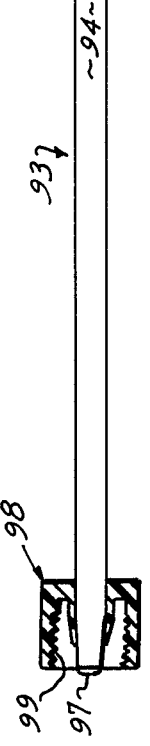
FIG. 4 is a side view of an alternative electrode probe for the analyzer of FIG. 2.

With reference now to FIG. 4, an alternative electrode probe 93 includes a cable 94 terminating at one end in a contact electrode 96. The probe 93 is used in place of the electrode 26 to permit checking a voltage test point in the well of a high voltage supply. The cable 94 is terminated at its second end in a contact element 97, and this end of the cable is secured within a nut assembly 98. The nut assembly 98 is threaded as indicated at 99 on an interior wall, and the nut assembly 98 is threaded onto the leg 42 of the fitting 27 after the removal of the nut 44 carrying the electrode 26. When the nut assembly 98 is threaded onto the fitting 27, the contact element 97 is in electrical contact with the spring 58, within the bore 49 of the fitting, and an electrical connection is thereby completed between the electrode 96 and the distal end of the resistor 29.

With reference now to FIG. 5, the face 36 of the ammeter 24 of the analyzer includes separate scales 37, 38 and 39 for interpreting gun, cable and supply measurements, respectively. The gun scale 37 is marked to show a "most efficient" range 101; the cable scale 38 is marked to show a "most efficient" range 102; and the supply scale 39 is marked to show a "most efficient" range 103. Each scale, such as the gun scale 37, further includes an "efficient" range 104 of acceptable operation. As shown in FIG. 5, the scales are offset from one another in a manner that a greater ammeter current is required for an indication of "efficient" or "most efficient" operation for a supply measurement than for a cable measurement; and, in turn, a greater current is needed for a cable measurement than for a gun measurement. The different current requirements are due to resistance differences of the test points relative to one another.

With reference to FIGS. 1a and 1b, it can be seen that the total resistance in a combined coating system and analyzer "circuit" increases in moving from a supply measurement to a cable measurement to a gun measurement, thereby reducing the measured current for a given supply voltage. For a supply measurement, the electrode 96 is connected to the supply terminal 14, and a circuit is completed from the supply 11, through the analyzer resistors 29–32, and through the ammeter 24 to ground. In making a cable measurement, the electrode 26 is connected to the test point 18, and the cable resistance 17 is added to the series circuit. This reduces the measured current for a given supply voltage, and accordingly shifts the range 38 for the cable to the left (as shown in FIG. 5) with respect to the range 39 for the supply. Likewise, in making a gun measurement, the electrode 26 is connected.to the test point 12, and the gun resistance 19 is also added to the series circuit, further reducing the measured current and shifting the range 37 for the gun to the leftmost position (as shown in FIG. 5) with respect to the ranges 38 and 39 for the cable and supply, respectively.

The exact placement of the segments of the scales 37–39 on the meter face 36 depends upon the current-indicating range of the ammeter. The size of the "most efficient" scale segments, and the "efficient" scale segments, is selected dependent upon the requisite gun electrode voltage for proper operation of the electrostatic coating system.

While the invention has been described in connection with an analyzer 21 having an analog ammeter 24 in which a needle moves across a meter face, it will be understood that it is also applicable to analyzers employing other types of ammeters. For example, the ammeter 24 may take the form of an ammeter having a digital readout or alphanumeric display for each of the scales 37–39.

What is claimed is:

1. An analyzer for a high voltage electrostatic coating system comprising:
   an elongated analyzer body having a longest dimension with an end proximal to a user of the analyzer and a distal end;
   a meter mounted at the proximal end of the analyzer body having a meter face visible to a user of the analyzer;
   a high resistance path in the analyzer body having a first end coupled to the meter and having a second end;
   a fitting on the distal end of the analyzer body including a conductive path electrically coupled to the second end of the high resistance path in the analyzer body; and
   a conductive electrode electrically coupled to the conductive path of the fitting, for contacting test points of the electrostatic coating system, mounted on the fitting offset laterally relative to the longest dimension of the analyzer body so that the electrode and the meter face are simultaneously visible to a user of the analyzer.

2. The analyzer of claim 1 in which the fitting includes a first leg mounted on the distal end of the analyzer body and extending beyond said distal end in the direction of the longest dimension of the analyzer body, and a second leg upon which the conductive electrode is mounted extending laterally relative to the longest dimension of the analyzer body.

3. The analyzer of claim 2 in which the first leg of the fitting is mounted on the distal end of the analyzer body for rotation about an axis generally parallel to the longest dimension of the analyzer body.

4. The analyzer of claim 1 in which the fitting is rotatably mounted upon the distal end of the analyzer body.

5. The analyzer of claim 4 in which the fitting includes an electrically conductive surface electrically connected to said conductive path of the fitting, and further comprising (a) a contact element electrically connected to the second end of said high resistance path in the analyzer body and (b) means for maintaining said contact element in electrical contact with said conductive surface.

6. An analyzer for a high voltage electrostatic coating system comprising:
   an analyzer body;
   a high resistance path in the analyzer body having a first end and a second end;
   a conductive electrode mounted on the analyzer body and coupled to the first end of the high resistance path, for contacting test points of an electrostatic coating system which are separated from one another by substantial resistances; and
   an ammeter, mounted on the analyzer body, having a first terminal to be coupled to ground and having a second terminal coupled to the second end of the resistance path in the analyzer body, including (a) a meter needle whose deflection is dependent upon the current through the ammeter and (b) a meter face across which the meter needle is deflected, the meter face having a different scale related to each said test point, the scales being offset from one another along the path of the meter needle to compensate for resistance differences between the test points.

7. The analyzer of claim 6 in which the analyzer body is elongated having a longest dimension with an end proximal to a user of the analyzer in which the ammeter is mounted, and further comprising a fitting on the distal end of the analyzer body including a conductive path electrically coupled to the first end of the high resistance path in the analyzer body, the conductive electrode being electrically coupled to the conductive path of the fitting and mounted on the fitting offset laterally relative to the longest dimension of the analyzer body so that the electrode and the meter face are simultaneously visible to a user of the analyzer.

8. An analyzer for a high voltage electrostatic coating system comprising:
   an analyzer body;
   a high resistance path in the analyzer body having a first end and a second end;
   a conductive electrode mounted on the analyzer body and coupled to the first end of the high resistance path, for contacting test points of an electrostatic coating system which are separated from one another by substantial resistances; and
   an ammeter, mounted on the analyzer body, having a first terminal to be coupled to ground and having a second terminal coupled to the second end of the resistance path in the analyzer body, the ammeter including means for presenting electrical current readings in the form of different scales each related to one of said test points, to compensate for resistance differences between the test points.

* * * * *